United States Patent
Kim et al.

(10) Patent No.: US 9,608,432 B2
(45) Date of Patent: Mar. 28, 2017

(54) ELECTRIC LEAKAGE DETERMINATION CIRCUIT FOR ELECTRIC LEAKAGE CIRCUIT BREAKER

(71) Applicant: LSIS CO., LTD., Anyang-si, Gyeonggi-do (KR)

(72) Inventors: Dong Hyun Kim, Seoul (KR); Jong Kug Seon, Seoul (KR); Chel Ho Chung, Anyang-si (KR)

(73) Assignee: LSIS CO., LTD., Anyang-si (KR)

( * ) Notice: Subject to any disclaimer, the term of this patent is extended or adjusted under 35 U.S.C. 154(b) by 79 days.

(21) Appl. No.: 14/738,732

(22) Filed: Jun. 12, 2015

(65) Prior Publication Data
US 2016/0013630 A1 Jan. 14, 2016

(30) Foreign Application Priority Data
Jul. 11, 2014 (KR) .................. 10-2014-0087615

(51) Int. Cl.
*H02H 3/00* (2006.01)
*H02H 3/16* (2006.01)
(Continued)

(52) U.S. Cl.
CPC ........... *H02H 3/162* (2013.01); *G01R 31/025* (2013.01); *H02H 3/33* (2013.01); *H02H 1/0015* (2013.01);
(Continued)

(58) Field of Classification Search
USPC ................................. 361/42, 86–87
See application file for complete search history.

(56) References Cited

U.S. PATENT DOCUMENTS

| | | | |
|---|---|---|---|
| 2002/0085326 A1* | 7/2002 | Kim .................. | H02H 3/04 361/42 |
| 2004/0145841 A1* | 7/2004 | Lambardin ............ | H02H 3/332 361/42 |
| 2010/0324747 A1* | 12/2010 | Lee .................. | H02H 3/33 700/293 |

FOREIGN PATENT DOCUMENTS

| | | |
|---|---|---|
| DE | 19729168 | 1/1998 |
| EP | 2306487 | 4/2011 |

(Continued)

OTHER PUBLICATIONS

European Patent Office Application Serial No. 15172254.3, Search Report dated Nov. 6, 2015, 6 pages.

(Continued)

*Primary Examiner* — Danny Nguyen
(74) *Attorney, Agent, or Firm* — Lee, Hong, Degerman, Kang & Waimey PC

(57) ABSTRACT

An electric leakage determination circuit for an electric leakage circuit breaker according to the invention comprises a zero current transformer on an alternating-current circuit to provide an electric leakage detection signal upon occurrence of electric leakage, a filter circuit unit connected to an output terminal of the zero current transformer to remove noise, and an electric leakage determination circuit unit comparing a voltage value of the electric leakage detection signal with a first reference voltage value, to be charged with electric charges when the voltage value is not smaller than the first reference voltage value and discharge electric charges when being smaller than the first reference voltage value, and comparing a charged voltage value with a second reference voltage value to determine occurrence of electric leakage when the charged voltage value is not smaller than the second reference voltage value.

4 Claims, 3 Drawing Sheets

(51) Int. Cl.
*G01R 31/02* (2006.01)
*H02H 3/33* (2006.01)
*H02H 1/00* (2006.01)
*H02H 9/02* (2006.01)

(52) U.S. Cl.
CPC ............. *H02H 3/331* (2013.01); *H02H 3/338* (2013.01); *H02H 9/02* (2013.01)

(56) References Cited

FOREIGN PATENT DOCUMENTS

| | | |
|---|---|---|
| GB | 2244397 | 11/1991 |
| JP | 3-265421 | 11/1991 |
| JP | 07-046749 | 2/1995 |
| JP | 10-94161 | 4/1998 |
| JP | 2010272523 | 12/2010 |

OTHER PUBLICATIONS

Japan Patent Office Application Serial No. 2015-135073, Office Action dated May 17, 2016, 2 pages.
Japan Patent Office Application No. 2015-135073, Notice of Allowance dated Nov. 29, 2016, 2 pages.

\* cited by examiner

ELECTRIC LEAKAGE DETERMINATION CIRCUIT FOR ELECTRIC LEAKAGE CIRCUIT BREAKER

CROSS-REFERENCE TO RELATED APPLICATION

Pursuant to 35 U.S.C. §119(a), this application claims the benefit of earlier filing date and right of priority to Korean Application No. 10-2014-0087615, filed on Jul. 11, 2014, the contents of which is incorporated by reference herein in its entirety.

BACKGROUND OF THE DISCLOSURE

1. Field of the Disclosure

This disclosure relates to an electric leakage circuit breaker, and more particularly, an electric leakage determination circuit for an electric leakage circuit breaker, capable of improving reliability of electric leakage detection.

2. Background of the Disclosure

An electric leakage circuit breaker refers to a circuit breaker which further has a function of detecting an occurrence of electric leakage and automatically breaking a circuit when the occurrence of the electric leakage is detected, in addition to functions of a typical circuit breaker.

In the electric leakage circuit breaker, an electric leakage determination circuit comprises a circuit section which determines an occurrence of electric leakage by acquiring an electric leakage detection signal on a three-phases alternating-current (abbreviated as "AC" hereinafter) circuit using a characteristic of a zero current transformer (hereinafter, briefly referred to as ZCT), which generates a secondary induced voltage upon the occurrence of the electric leakage, amplifying the electric leakage detection signal, and comparing the amplified value with a reference value. One example according to the related art electric leakage determination circuit will be understood by referring to the Korean granted Patent No. KR10-0991958 B1 which has been granted to the applicant of this application.

Also, in relation to the electric leakage determination circuit according to the granted Patent, an improved technology, which further employs a delay circuit section for preventing wrong determination of the electric leakage due to temporary noise, has been introduced.

However, the improved technology also teaches the configuration of determining the electric leakage and generating a trip signal after a lapse of a predetermined time of delay from an initial time point of exceeding a reference value according to the comparison result. Therefore, the technology is highly likely to bring about a malfunction of the determination circuit under an environment that noise is frequently generated due to various causes. This results in lowering operation reliability of the electric leakage circuit breaker.

SUMMARY OF THE DISCLOSURE

Therefore, to obviate the related art problem, an aspect of the detailed description is to provide an electric leakage determination circuit for an electric leakage circuit breaker, capable of improving reliability of the determination of the electric leakage.

To achieve these and other advantages and in accordance with the purpose of this disclosure, as embodied and broadly described herein, there is provided an electric leakage determination circuit for an electric leakage circuit breaker, the determination circuit comprising:

a zero current transformer that is disposed on an alternating current circuit and provides an electric leakage detection signal as a secondary induced voltage signal upon an occurrence of electric leakage;

a filter circuit unit that is connected to an output terminal of the zero current transformer and configured to remove a noise signal for output;

an electric leakage determination circuit unit that is connected to an output terminal of the filter circuit unit, and configured to compare a voltage value of the electric leakage detection signal, received from the filter circuit unit, with a first reference voltage value, and decide the occurrence of the electric leakage based on the comparison result, wherein the electric leakage determination circuit unit comprises:

a first comparator that is configured to output a pulse signal having a logical value of "1" when an absolute value of the electric leakage detection signal provided from the zero current transformer is equal to or greater than the first reference voltage value; and a charge storage delay signal generator that is connected to an output terminal of the first comparator, and configured to be charged with electric charges according to the pulse signal when an output of the first comparator has the logical value of "1," and discharge electric charges when the output of the first comparator has a logical value of "0," wherein the charge storage delay signal generator outputs a pulse signal having the logical value of "1" indicating the occurrence of the electric leakage when a voltage value by the electric charges charged according to the pulse signal output from the first comparator is equal to or greater than a second reference voltage value.

According to one aspect of the present invention, the electric leakage determination circuit unit further comprises a logical circuit section that is connected to an output terminal of the charge storage delay signal generator and the output terminal of the first comparator, and configured to finally output a trip control signal for controlling the electric leakage circuit breaker to break a circuit when the pulse signal output from the charge storage delay signal generator and the pulse signal output from the first comparator have the same logical value of "1".

In accordance with another aspect of the present invention, the logical circuit section is configured to output the trip control signal at a rising edge of the pulse signal output from the first comparator.

In accordance with still another aspect of the present invention, the charge storage delay signal generator comprises:

a condenser circuit section that is configured to be charged with electric charges according to the pulse signal when the output of the first comparator has the logical value of "1" and discharge electric charges when the output of the first comparator has the logical value of "0", and a second comparator that is connected to the condenser circuit section and configured to compare a charged voltage of the condenser circuit section with the second reference voltage value, and output a pulse signal having the logical value of "1" indicating the occurrence of the electric leakage when a voltage value by the electric charges charged in the condenser circuit section is equal to or greater than the second reference voltage value.

Further scope of applicability of the present application will become more apparent from the detailed description given hereinafter. However, it should be understood that the detailed description and specific examples, while indicating preferred embodiments of the disclosure, are given by way of illustration only, since various changes and modifications within the spirit and scope of the disclosure will become apparent to those skilled in the art from the detailed description.

BRIEF DESCRIPTION OF THE DRAWINGS

The accompanying drawings, which are included to provide a further understanding of the disclosure and are incorporated in and constitute a part of this disclosure, illustrate exemplary embodiments and together with the description serve to explain the principles of the disclosure.

In the drawings.

DETAILED DESCRIPTION OF THE DISCLOSURE

The configuration and its operation effects of the present invention to achieve these and other objectives will be more obviously understood by the following description of the preferred embodiments of the present invention, with reference to the accompanying drawings.

Hereinafter, description will be given with reference to FIG. 1 which is a block diagram illustrating a configuration of an electric leakage circuit breaker having an electric leakage determination circuit in accordance with a preferred embodiment of the present invention.

Figure 1:
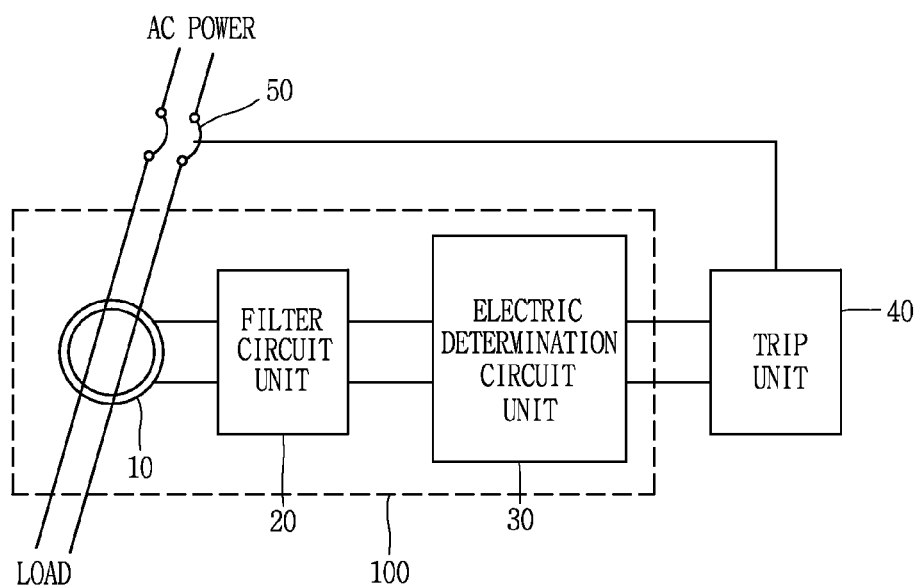
FIG. 1 is a block diagram illustrating a configuration of an electric leakage circuit breaker having an electric leakage determination circuit in accordance with a preferred embodiment of the present invention.

As illustrated in FIG. 1, an electric leakage circuit breaker comprises a trip unit 40, a switching mechanism 50, and an electric leakage determination circuit 100.

The trip unit 40, as well known, includes mechanisms, such as an electromagnet that is magnetized or demagnetized according to whether or not a trip control signal is applied, and provided with a trip coil and a core, an armature that is movable to be attracted toward the electromagnet by a magnetic force or recovered to a spaced apart position away from the electromagnet according to magnetization or demagnetization of the electromagnet, and a trip bar that is rotatable by being pressed due to the armature. When the trip unit 40 receives the trip control signal, the armature and the trip bar drive a lock mechanism of the switching mechanism 50, which will be explained later, to a release position such that the switching mechanism 50 is triggered to an automatic circuit breaking position (trip position).

The switching mechanism 50, as well known, may include a lock mechanism having a latch which can be unlocked by the trip bar, a trip spring providing a mechanical driving force for performing a trip operation and locked in a charged state with elastic energy or released to discharge the charged elastic energy, upper and lower links that transfer the elastic energy of the trip spring to a movable contact arm, a shaft rotatably supporting the movable contactor and operably connected with the upper and lower links, and a stationary contact arm and the movable contact arm having contacts, respectively that are final switching contact portions.

The electric leakage determination circuit 100, as illustrated in FIG. 1, comprises a zero current transformer 10, a filter circuit unit 20, an electric leakage determination circuit unit 30.

The zero current transformer 10, as illustrated in FIG. 1, is installed on an AC circuit disposed between an AC electric power source and an AC electric load and provides an electric leakage detection signal as a secondary induced voltage signal upon an occurrence of the electric leakage. The zero current transformer 10, as well known, may include an annular core installed to penetrate through the AC circuit, and a coil wound on the annular core to induce the secondary induced voltage signal.

The filter circuit unit 20 is connected to an output terminal of the zero current transformer 10 to filter out a noise signal. According to the preferred embodiment, the filter circuit unit 20 may be configured as a low pass filter through which an AC signal of a low frequency, for example, 60 Hz, is allowed to pass and by which high frequency noise is removed.

The electric leakage determination circuit unit 30 which is an electric leakage detection circuit portion corresponds to a circuit unit for determining an occurrence or non-occurrence of electric leakage on the basis of the electric leakage detection signal transmitted from the zero current transformer 10 and the filter circuit unit 20. In more detail, the electric leakage determination circuit unit 30 is connected to an output terminal of the filter circuit unit 20. The electric leakage determination circuit unit 30 compares a voltage value of the electric leakage detection signal, received through the filter circuit unit 20, with a predetermined first reference voltage value. When the voltage value of the electric leakage detection signal is equal to or greater than the first reference voltage value, the electric leakage determination circuit unit 30 is charged with electric charges. On the other hand, when the voltage value of the electric leakage detection signal is smaller than the first reference voltage value, the electric leakage determination circuit unit 30 discharges electric charges. Also, the electric leakage determination circuit unit 30 compares a cumulatively-charged voltage value with a second reference voltage value. When the charged voltage value is equal to or greater than the second reference voltage value, the electric leakage determination circuit unit 30 determines the occurrence of the electric leakage.

Hereinafter, description will be given of a detailed configuration of the electric leakage determination circuit unit 30 with reference to FIG. 2.

Figure 2:
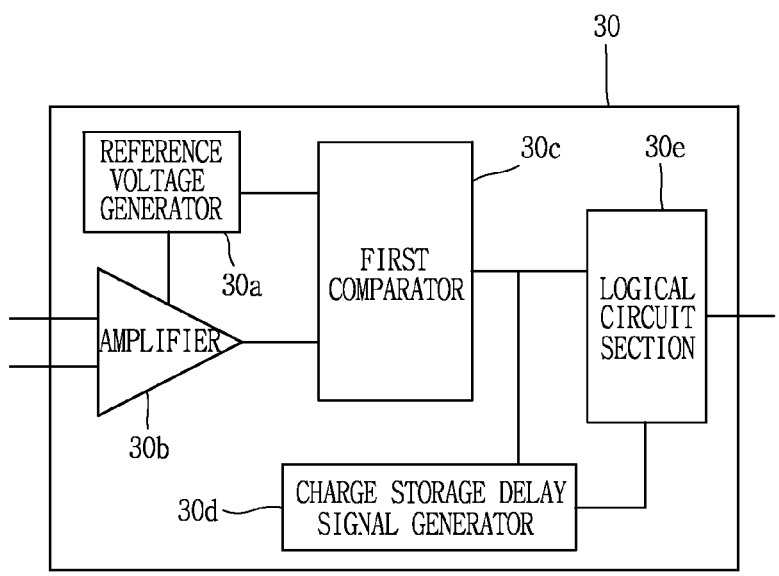
FIG. 2 is a block diagram illustrating a configuration of only an electric leakage determination circuit for an electric leakage circuit breaker in accordance with a preferred embodiment of the present invention.

As illustrated in FIG. 2, the electric leakage determination circuit unit 30 comprises a first comparator 30c, and a charge storage delay signal generator 30d.

The first comparator 30c outputs a pulse signal having a logical value of "1" when an absolute value of an electric leakage detection signal transmitted from the electric leakage detection part is equal to or greater than the first reference voltage value.

Figure 4:
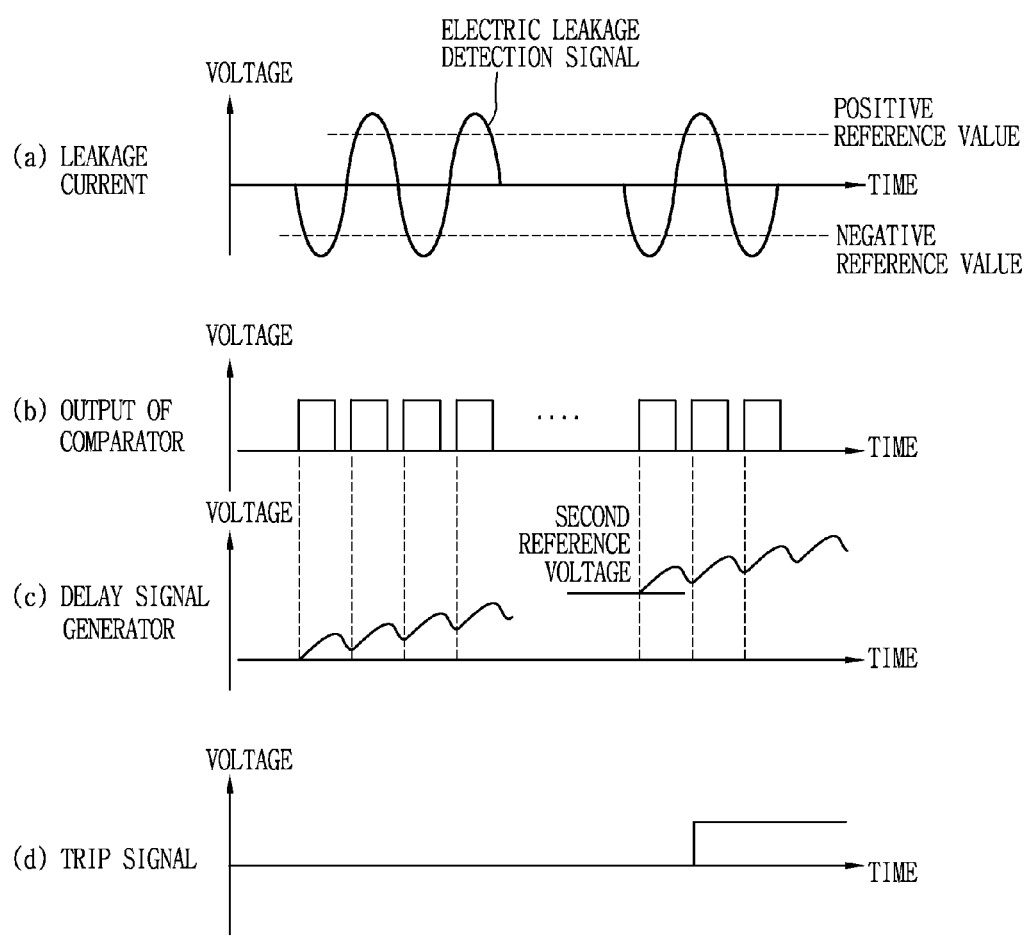
FIG. 4 is a view illustrating a waveform of an output signal for each circuit section for explaining an operation of the electric leakage determination circuit for the electric leakage circuit breaker in accordance with the preferred embodiment of the present invention.

As illustrated in FIG. 4A, the electric leakage detection signal has a positive voltage value and a negative voltage value, and represents an AC waveform which varies similar to a sine wave. Here, the absolute value of the electric leakage detection signal refers to an absolute value for the positive voltage value and the negative voltage value. The first reference voltage value is an absolute value of a positive reference value indicated with an upper dashed line and a negative reference value indicated with a lower dashed line in FIG. 4A, namely, refers to one reference value.

The charge storage delay signal generator 30d is connected to an output terminal of the first comparator 30c. The charge storage delay signal generator 30d is charged with electric charges according to the pulse signal output by the first comparator 30c, in a manner of being charged with electric charges according to the pulse signal when the output of the first comparator 30c has a logical value of "1," and discharging electric charges when the output of the first comparator 30c has a logical value of "0." The charge storage delay signal generator 30d outputs a pulse signal having the logical value of "1" indicating the occurrence of the electric leakage when a voltage value by the charged electric charges is equal to or greater than the second reference voltage value.

As illustrated in FIG. 2, the electric leakage determination circuit unit 30 further comprises a logical circuit section 30e.

The logical circuit section 30e is connected to an output terminal of the charge storage delay signal generator 30d and the output terminal of the first comparator 30c. The logical circuit section 30e outputs a trip control signal to control the electric leakage circuit breaker to break (in other words "trip") a circuit when both of the pulse signal output from the charge storage delay signal generator 30d and the pulse signal output from the first comparator 30c have the same logical value of "1." The trip control signal is transferred to the trip unit 40 and thereby magnetizes the electromagnet of the trip unit 40 having the trip coil and the core. Accordingly, the trip unit 40 triggers the switching mechanism 50 to an automatic circuit breaking position, namely, a trip position.

According to the preferred embodiment, the logical circuit section 30e may be configured to output the trip control signal at a rising edge of the pulse signal output from the first comparator 30c.

Referring to FIG. 2, the electric leakage determination circuit unit 30 may further comprise a reference voltage generator 30a and an amplifier 30b.

The reference voltage generator 30a is connected to the first comparator 30c and the amplifier 30b to provide a reference voltage signal having the first reference voltage value.

The amplifier 30b is connected to an output terminal of the filter circuit unit 30 of FIG. 1 to amplify the small electric leakage detection signal output from the filter circuit unit 20.

Hereinafter, description will be given of a more detailed configuration of the charge storage delay signal generator 30d, with reference to FIG. 3.

Figure 3:
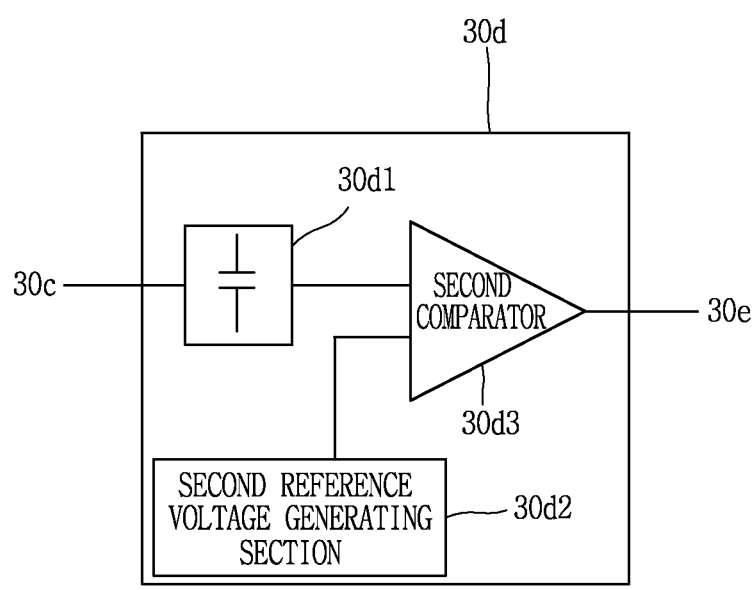
FIG. 3 is a block diagram illustrating a detailed configuration of an electric charge (or charge) storage delay signal generator of the electric leakage determination circuit for the electric leakage circuit breaker in accordance with the preferred embodiment of the present invention.

As illustrated in FIG. 3, the charge storage delay signal generator 30d comprises a condenser circuit section 30d1 and a second comparator 30d3.

The reference numeral 30d2 in FIG. 3 designates a second reference voltage generating section which is a circuit section for providing a signal indicating the second reference voltage value to the second comparator 30d3.

An input terminal of the condenser circuit section 30d1 is connected to the output terminal of the first comparator 30c and an output terminal thereof is connected to one input terminal of the second comparator 30d3.

The condenser circuit section 30d1 is charged with electric charges according to the pulse signal when the output of the first comparator 30c has the logical value of "1," and discharges electric charges when the output of the first comparator 30c has the logical value of "0." Here, the condenser circuit section 30d1 may comprise a condenser, and a circuit portion providing a voltage signal indicating a charged voltage of the condenser.

One input terminal of the second comparator 30d3 may be connected to the output terminal of the condenser circuit section 30d1, another input terminal thereof may be connected to an output terminal of the second reference voltage generating section 30d2, and an output terminal thereof may be connected to the logical circuit section 30e.

The second comparator 30d3 compares the charged voltage of the condenser circuit section 30d1 with the second reference voltage vale. When the charged voltage of the condenser circuit section 30d1 is equal to or greater than the second reference voltage value, the second comparator 30d3 outputs a pulse signal having the logical value "1" indicating the occurrence of the electric leakage.

Hereinafter, description will be given of an operation of an electric leakage determination circuit for an electric leakage circuit breaker according to the preferred embodiment of the present invention having such configuration, with reference to FIG. 4A-4D in addition to FIGS. 1 to 3.

As illustrated in FIG. 4A, it is assumed that an electric leakage detection signal consecutively having a positive voltage value and a negative voltage value is detected by the zero current transformer 10 illustrated in FIG. 1, input to the electric leakage determination circuit unit 30 through the filter circuit unit 20, amplified by the amplifier 30b of FIG. 2, and then provided to the first comparator 30c.

In turn, the first comparator 30c of FIG. 2, as illustrated in FIG. 4B, outputs a pulse signal having a logical value of "1" for a period of time that a voltage value detected according to the electric leakage detection signal is equal to or greater than an absolute value of a positive reference value and a negative reference value illustrated in FIG. 4A, namely, a first reference voltage value.

The charge storage delay signal generator 30d illustrated in FIG. 2 charges electric charges according to the pulse signal into the condenser circuit section 30d1 of FIG. 3 when the output of the first comparator 30c has the logical value of "1," as similar to a voltage wave form illustrated in FIG. 4C. When the output of the first comparator 30c has the logical value of "0," the charge storage delay signal generator 30d discharges electric charges from the condenser circuit section 30d1 and is charged with electric charges according to the pulse signal output from the first comparator 30c.

When the electric leakage detection signal, which is equal to or greater than the absolute value of the positive reference value and the negative reference value illustrated in FIG. 4A, namely, the first reference voltage value, is repetitively generated due to a continuous electric leakage from a circuit to which the electric leakage circuit breaker is connected, the charged voltage of the condenser circuit section 30d1 is equal to or greater than a second reference voltage value as similar to a voltage wave form illustrated in FIG. 4C. Here, the charge storage delay signal generator 30d outputs an output signal having the logical value of "1."

Accordingly, the logical circuit section 30e of FIG. 2 outputs a trip control signal, as illustrated in FIG. 4D, for controlling the electric leakage circuit breaker to break the circuit when both of the pulse signal output from the charge storage delay signal generator 30d and the pulse signal output from the first comparator 30c have the logical value of "1." The trip control signal is transferred to the trip unit

40 so as to magnetize the electromagnet having the trip coil and the core. The trip unit 40 then triggers the switching mechanism 50 to an automatic circuit breaking position, namely, the trip position. Therefore, an AC circuit between a power source side and a load side connected by the electric leakage circuit breaker may be tripped, thereby protecting material resources, such as a load side circuit, load devices connected to the load side circuit and the like, and human resources from the electric leakage.

Specifically, the logical circuit section 30e, as illustrated in FIG. 4D, may output the trip control signal at a rising edge of the pulse signal output from the first comparator 30c, thereby further improving reliability of the electric leakage determination.

Meanwhile, when the electric leakage detection signal, which is equal to or greater than the absolute value of the positive reference value and the negative reference value illustrated in FIG. 4A, namely, the first reference voltage value, is merely temporarily generated due to temporary electric leakage occurred from the circuit to which the electric leakage circuit breaker is connected, the charged voltage of the condenser circuit section 30d1 is temporarily charged and then continuously discharged, thereby failing to reach the second reference voltage value, as illustrated in of FIG. 4C. Accordingly, the second comparator 30d3 of the charge storage delay signal generator 30d compares the charged voltage of the condenser circuit section 30d1 with the second reference voltage value, and outputs a pulse signal having the logical value of "0" indicating non-occurrence of the electric leakage because the charged voltage of the condenser circuit section 30d1 is smaller than the second reference voltage value.

Therefore, the logical circuit section 30e of the electric leakage determination circuit unit 30 does not output the trip control signal. In response to this, the electromagnet having the trip coil and the core is demagnetized, and thus the trip unit 40 does not trigger the switching mechanism 50 to the trip position. This may prevent the electric leakage circuit breaker from being tripped due to a temporary noise electric leakage detection signal, resulting in fundamentally preventing a malfunction of the electric leakage circuit breaker, namely, breaking the AC circuit between the electric power source side and the electric load side due to the temporary noise.

This may enable prevention of an occurrence of great economical damage which is caused by an unnecessary stop of a production line, which results from unnecessary cutoff of electric power supplied to, for example, a motor of a production facility connected to the electric leakage circuit breaker.

As aforementioned, an electric leakage determination circuit for an electric leakage circuit breaker according to the present invention comprises a charge storage delay signal generator which is charged with electric charges when an electric leakage detection signal is equal to or greater than a reference value and discharges electric charges when the electric leakage detection signal is smaller than the reference value. With the configuration, upon an occurrence of temporary noise, a charged voltage of the charge storage delay signal generator may be lowered than a reference voltage value by way of temporarily charging electric charges and then discharging electric charges. Accordingly, a trip control signal for breaking a circuit may not be output. On the other hand, the charged voltage of the charge storage delay signal generator is equal to or greater than the reference voltage value only upon a continuous electric leakage detection for a predetermined time, and thus the trip control signal for breaking the circuit can be output. This may provide an effect of fundamentally preventing a malfunction of the electric leakage circuit breaker that breaks (or trips) the circuit according to temporary noise.

The electric leakage determination circuit for the electric leakage circuit breaker according to the present invention may further comprise a logical circuit section. With the configuration, a trip control signal for breaking the circuit can be output only when a first electric leakage determination input signal in response to an output of the charge storage delay signal generator and a second electric leakage determination input signal which is output when an electric leakage detection signal is equal to or greater than a predetermined reference value have the same logical value of "1," thereby further improving reliability of the electric leakage determination.

The charge storage delay signal generator in the electric leakage determination circuit for the electric leakage circuit breaker comprise a condenser circuit section that is charged with electric charges according to the pulse signal when the output of the first comparator, which compares a voltage value of an electric leakage detection signal with a reference value, has a logical value of "1" and discharges electric charges when the output of the first comparator has a logical value of "0," and a second comparator that compares a charged voltage of the condenser circuit section with a second reference voltage value to output a pulse signal having the logical value of "1" indicating an occurrence of the electric leakage when the charged voltage value of the condenser circuit section is not smaller than the second reference voltage. Therefore, the charged voltage of the condenser circuit section can be greater than the second reference voltage value of the second comparator only while the electric leakage is continuously detected for a predetermined time. This may result in obtaining an effect of fundamentally preventing a wrong operation of the electric leakage circuit breaker that trips a circuit according to temporary noise.

In the electric leakage determination circuit for the electric leakage circuit breaker according to the present invention, a logical circuit section for finally outputting a trip control signal may be configured to output the trip control signal at a rising edge of a pulse signal output from a first comparator, thereby further improving reliability of electric leakage determination.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. An electric leakage determination circuit for an electric leakage circuit breaker, the determination circuit comprising:
   a zero current transformer that is disposed on an alternating current circuit and provides an electric leakage detection signal as a secondary induced voltage signal upon an occurrence of electric leakage;
   a filter circuit unit that is connected to an output terminal of the zero current transformer and configured to remove a noise signal for output;

an electric leakage determination circuit unit that is connected to an output terminal of the filter circuit unit, and configured to compare a voltage value of the electric leakage detection signal, received from the filter circuit unit, with a first reference voltage value, and decide the occurrence of the electric leakage based on the comparison result, wherein the electric leakage determination circuit unit comprises:

a first comparator that is configured to output a pulse signal having a logical value of "1" when an absolute value of the electric leakage detection signal provided from the zero current transformer is equal to or greater than the first reference voltage value; and a charge storage delay signal generator that is connected to an output terminal of the first comparator, and configured to be charged with electric charges according to the pulse signal when an output of the first comparator has the logical value of "1," and discharge electric charges when the output of the first comparator has a logical value of "0," wherein the charge storage delay signal generator outputs a pulse signal having the logical value of "1" indicating the occurrence of the electric leakage when a voltage value by the electric charges charged according to the pulse signal output from the first comparator is equal to or greater than a second reference voltage value.

2. The determination circuit of claim 1, wherein the electric leakage determination circuit unit further comprises a logical circuit section that is connected to an output terminal of the charge storage delay signal generator and the output terminal of the first comparator, and configured to finally output a trip control signal for controlling the electric leakage circuit breaker to break a circuit when the pulse signal output from the charge storage delay signal generator and the pulse signal output from the first comparator have the same logical value of "1".

3. The determination circuit of claim 2, wherein the logical circuit section is configured to output the trip control signal at a rising edge of the pulse signal output from the first comparator.

4. The determination circuit of claim 1, wherein the charge storage delay signal generator comprises:

a condenser circuit section that is configured to be charged with electric charges according to the pulse signal when the output of the first comparator has the logical value of "1" and discharge electric charges when the output of the first comparator has the logical value of "0", and a second comparator that is connected to the condenser circuit section and configured to compare a charged voltage of the condenser circuit section with the second reference voltage value, and output a pulse signal having the logical value of "1" indicating the occurrence of the electric leakage when a voltage value by the electric charges charged in the condenser circuit section is equal to or greater than the second reference voltage value.

* * * * *